United States Patent [19]

Hogue

[11] Patent Number: 4,575,867

[45] Date of Patent: Mar. 11, 1986

[54] HIGH SPEED PROGRAMMABLE PRESCALER

[75] Inventor: Noel E. Hogue, Cedar Rapids, Iowa

[73] Assignee: Rockwell International Corporation, El Segundo, Calif.

[21] Appl. No.: 406,419

[22] Filed: Aug. 9, 1982

[51] Int. Cl.[4] .................... H03K 21/36; H03K 23/26
[52] U.S. Cl. .................................... 377/110; 377/47; 377/52; 377/119
[58] Field of Search .................... 377/52, 110, 119, 47

[56] References Cited

U.S. PATENT DOCUMENTS

| 3,493,872 | 2/1970 | Sepe | 377/110 |
| 3,811,092 | 5/1974 | Charbonnier | 377/110 X |
| 4,016,495 | 4/1977 | Machanian | 377/110 X |
| 4,264,863 | 4/1981 | Kojima | 377/110 |
| 4,331,926 | 5/1982 | Minakuchi | 377/110 |

FOREIGN PATENT DOCUMENTS 2079999  1/1982  United Kingdom ................ 377/110

OTHER PUBLICATIONS

Paphitis, *IEEE Trans. on Instrumentation and Measurement*, vol. 1M-26, No. 4, pp. 396-402; 12/1977.
Cavalli-Sforza et al, *Nuclear Instruments and Methods*, 131, No. 3, Dec. 28, 1975, pp. 575-578; North-Holland Publishing Co.

*Primary Examiner*—Larry N. Anagnos
*Attorney, Agent, or Firm*—George A. Montayne; H. Fredrick Hamann

[57] ABSTRACT

A high speed programmable prescaler has an input divider that divides an input stream of clock pulses by either 2 or upon command by 3. Connected to the input divider is a plurality of dividers that are electrically cascaded together from a first member to last member with each member of the plurality of dividers being capable of dividing the clock pulses applied to it by either 2 or upon command by 3. A prescaler selects either 2 or 3 for dividing the input stream of clock pulses so that number of clock pulses necessary to obtain an output pulse can be represented by the equation of $2^N+M$ where N is the number of members of the plurality of dividers and M is the control number having a range of 0 to $2^N-1$.

The critical path delays are minimized by using a flip-flop in the input divider to divide by 2 and then on command shifting the output of the flip-flop by 180° to obtain the divide by 3 function.

7 Claims, 4 Drawing Figures

HIGH SPEED PROGRAMMABLE PRESCALER

BACKGROUND OF THE INVENTION

This invention relates to high speed programmable prescalers and, in particular, to high speed programmable prescalers that require a minimum count to accomplish a full program.

Very high speed prescalers that perform a divide by 10 or 11 under a mode control and operate within the 650 MHz range are known in the art. An example of these devices is the 11C90 manufactured by Fairchild Semiconductor Components Group of Fairchild Camera and Instrument Corporation. These devices have aroused great interest in VHF and UHF counters for applications in mobile communicational and digitally tuned FM and TV receivers. Although the above mentioned applications differ in many ways, they all have one thing in common; the need for high speed programmable prescalers. The prior art modulo-2 type programmable prescalers have basically two major limitations. One, clocking speeds are limited by critical path delays and two, the minimum count necessary to accomplish a full program is limited.

SUMMARY OF THE INVENTION

A high speed programmable prescaler has an input divider that divides an input stream of clock pulses by either 2 or upon command by 3. Connected to the input divider is a plurality of dividers that are electrically cascaded together from a first member to last member with each member of the plurality of dividers being capable of dividing the clock pulses applied to it by either 2 or upon command by 3. A prescaler selects either 2 or 3 for dividing the input stream of clock pulses so that the number of clock pulses necessary to obtain an output pulse from the prescaler can be represented by the equation of $2^N+M$ where N is the number of members of the plurality of dividers and M is the control number having a range of 0 to $2^N-1$.

The critical path delays are minimized by using a flip-flop in the input divider to divide by 2 and then on command shifting the output of the flip-flop by 180° to obtain the divide by 3 function.

It is the object of the invention to provide a high speed programmable prescaler in which the clocking speed is not limited by critical path delays.

It is yet another object of the invention to provide a high speed programmable prescaler in which the minimum count to accomplish a full program is reduced to $2^{N-1}$ compared to a modulo-2 system minimum count of $2^N \times 2^{N-1}$.

It is yet another object of the invention to provide a high speed programmable prescaler that is highly integrable and allows the high speed capabilities of technologies such as silicon-on-sapphire and Galium Arsenide to be fully recognized.

It is yet another object of the invention to provide a programmable prescaler whose modulus control is binary based for use in microprocessor controlled systems.

BRIEF DESCRIPTION OF THE DRAWINGS

In order that the invention may be readily carried into practice, a number of embodiments will now be described in detail by way of example, with reference to the accompanying drawings in which.

DETAILED DESCRIPTION OF THE PREFERRED EMBODIMENT

Figure 1:
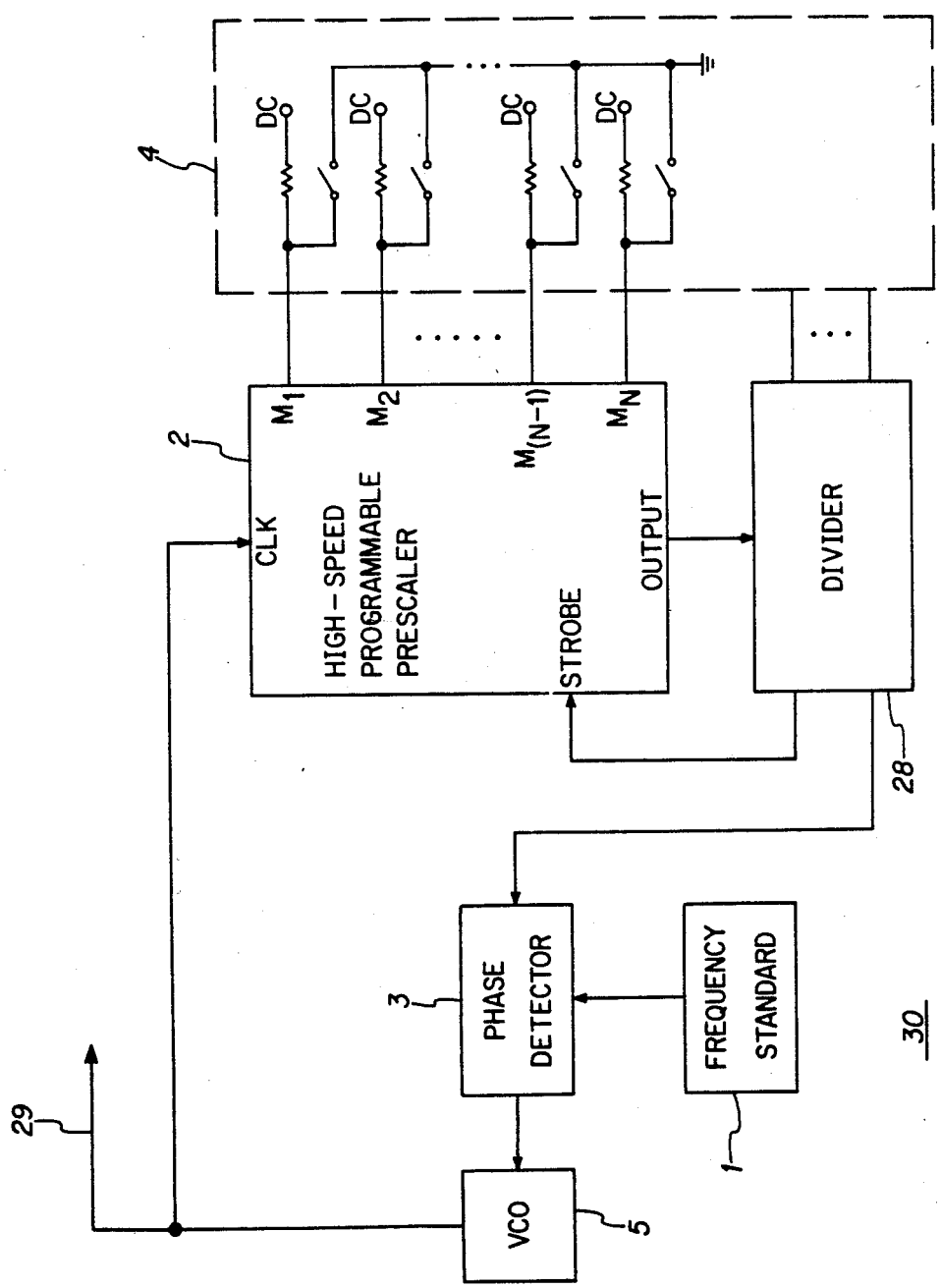
FIG. 1 is a block diagram of a frequency synthesizer incorporating a high speed programmable prescaler according to the invention.

In FIG. 1, to which reference should now be made, there is illustrated a block diagram of an application of a high speed programmable prescaler 2 in a frequency synthesizer 30 used in a radio transceiver. The operating frequency is provided by terminal 29 from a Voltage Control Oscillator (VCO) 5 and also to the high speed programmable prescaler 2. The high speed programmable prescaler will divide the output of the VCO 5 by $2^N$ where N is the number of stages of the prescaler. For example, if N is equal to 4 then the prescaler will divide the output frequency from the VCO 5 by 16. The scale of the prescaler 2 is established by the selector switch 4 which contains a plurality of switches for placing on the M terminals either a logic 0 or a logic 1. The placement of logic 1's will cause the high speed programmable prescaler 2 to weight or prescale the output of the high speed programmable prescaler by the binary number that is present on the $M_N$ terminals for one count cycle following a change in logic states by the strobe pulse that is present on the strobe terminal of the high speed programmable prescalers. This results in the clock pulses being divided by the equation of $2^N+M$ which, in the event N is equal to 4, will give the high speed programmable prescaler 2 the capabilities of dividing the clock pulse from the VCO 5 by 16 through 31 in response to logic state changes on the strobe terminal. The selector switches 4 also are used to select the scale of divider 28 for further dividing the output of the high speed programmable prescaler 2 and additionally the divider 28 provides, on a cyclic period, strobe pulses for switching to the prescale mode by the high speed programmable prescaler. The output of the divider 28 is applied to a phase detector 3 which compares the output of the divider 28 by a frequency standard 1. The phase difference is used to drive the VCO 5 which provides the output frequency on conductor 29.

Figure 2:
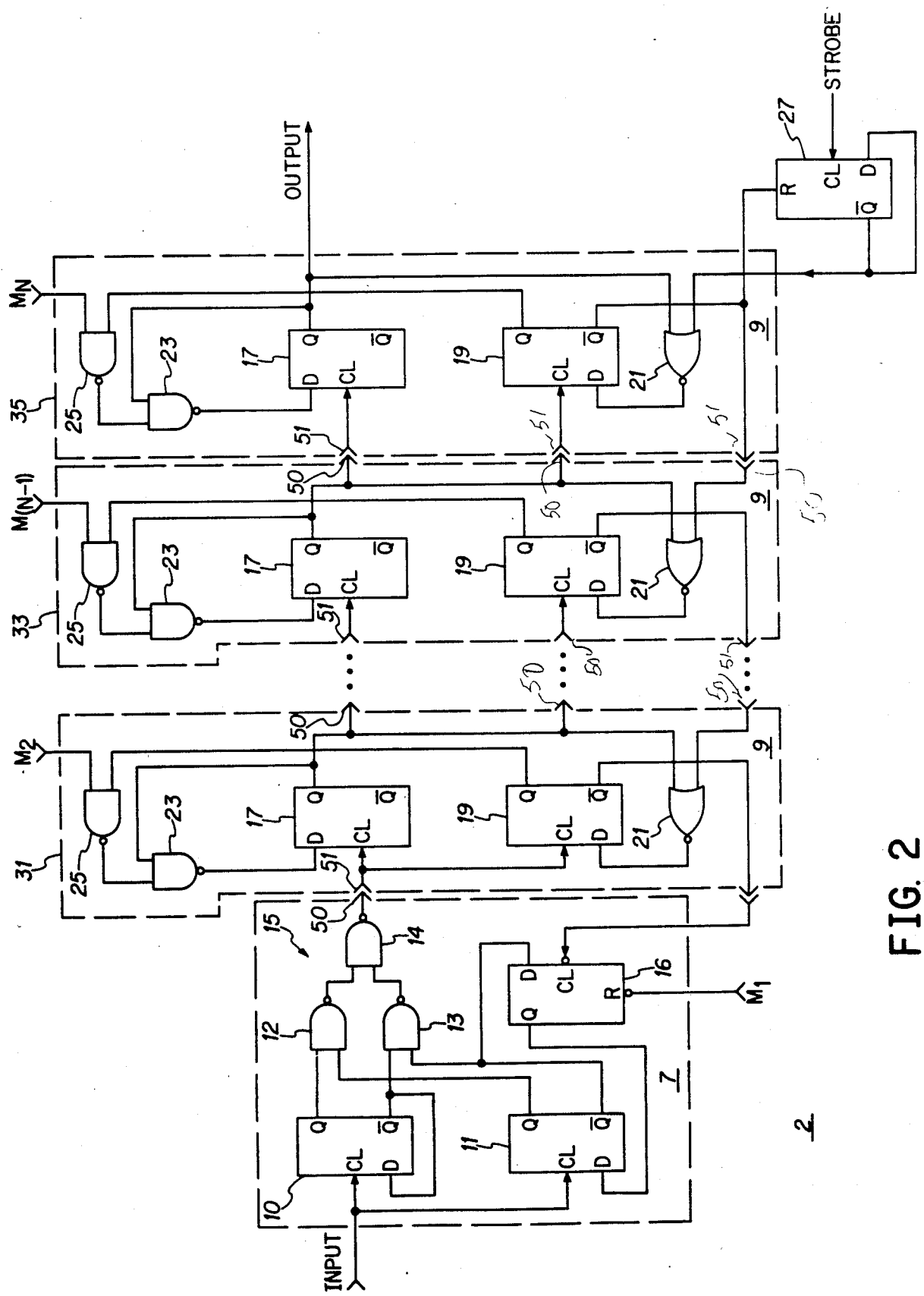
FIG. 2 is a schematic diagram of the high speed programmable prescaler according to the invention.

FIG. 2 is a schematic diagram of the high speed programmable prescaler 2 according to the ivention and should be referred to at this time. The architecture of the high speed programmable prescaler is based on two basic circuit configurations. One cmprises a divide by 2 or 3 circuit 9 which is repeated as often as necessary to produce the desired overall modulus. In the embodiment of FIG. 2 the divide by 2 or 3 circuit 9 is a circuit that is known in the art and was discussed in the service manual for an UHF radio set AN/PRC-66B published by Collins Radio Company of Canada Limited in 1969 and, in particular, on pages 4–14 through 4–17. The divide by 2 or 3 circuit is shown as stage 31, 33 and 35 of FIG. 2. The other circuit, which is the input circuit, performs the divide by 2 or 3 function in a more advantageous manner. Advantage is taken of the fact that shifting the phase by 180° at the output of a divide by two flip-flop 10 is equivalent to a delay of one clock period at the divide by two flip-flop 10's input. In turn, a delay of one clock period is equivalent to counting one additional pulse thus giving divide by 3 instead of divide by 2, on command. This approach does not depend on path delays external to the basic divide by two flip-flop 10, and thus the circuit speed is limited only by the clocking speed of divide by two flip-flop 10 itself. This makes it practical to operate the high speed programmable prescaler well into the microwave region when manufactured with Galium-Arsenide devices. The input divider 7 includes the divide by two flip-flop 10 which divides the input signal by 2 and a phase shift flip-flop 11 which, in conjunction with the AND/OR device 15 that is comprised of the NAND gates 12, 13 and 14 will cause the output of the divide by two flip-flop 10 to be shifted in phase by 180° when the phase shift flip-flop 11 is strobed by the strobed flip-flop 16. The function of the strobed flip-flop 16 is to localize strobe synchronizations within the first stage and thus prevent speed degradation. The strobe flip-flop 16 may be disabled by connecting the M1 to a logic 0 potential and thus, the input divider circuit 7 will only perform a divide by 2 function. However, if the M1 terminal is connected to a logic 1 level, flip-flop 16 is allowed to respond to a strobe pulse from flip-flop 19, which in turn allows the divide by 3 function to be performed by flip-flops 10 and 11 due to the phase reversal action previously described.

The divide by 2 or 3 circuit 9 used for stages 31, 33 and 35 is a sequential logic circuit having a strobe memory flip-flop 19. When a strobe pulse appears at the D terminal of a strobe memory flip-flop 19, it is clocked to the true state by the next clock pulse. In turn, the divide flip-flop 17 is held with a logic 1 on its Q terminal for one additional clock period providing there is a logic 1 on the count control input terminal $M_2$ through $M_N$. This delay of one clock period results in the divide by 3 function for each of the divide by 2/3 circuits 9 that have a logic 1 connected to the appropriate M terminal. Because of interstage delays, this circuit works up to only about 70 percent of the speed of the divide flip-flops 17 and 19. However, since the first stage has reduced the clocking frequency to at least one half or 50 percent, the overall speed of the high speed programmable prescaler is still only limited by the speed of the divide by two flip-flop 10.

The function of the strobe flip-flop 27 in FIG. 2 is to synchronize an external strobe with the internal circuit timing, thus eliminating any time delay problems associated with the external circuitry. This is particularly important if the high speed programmable prescaler is built as a stand-alone component. If the high speed programmable prescaler 2 is built on a single chip part of a composite integrated circuit, the strobe flip-flop 27 may not be necessary.

Figure 3:
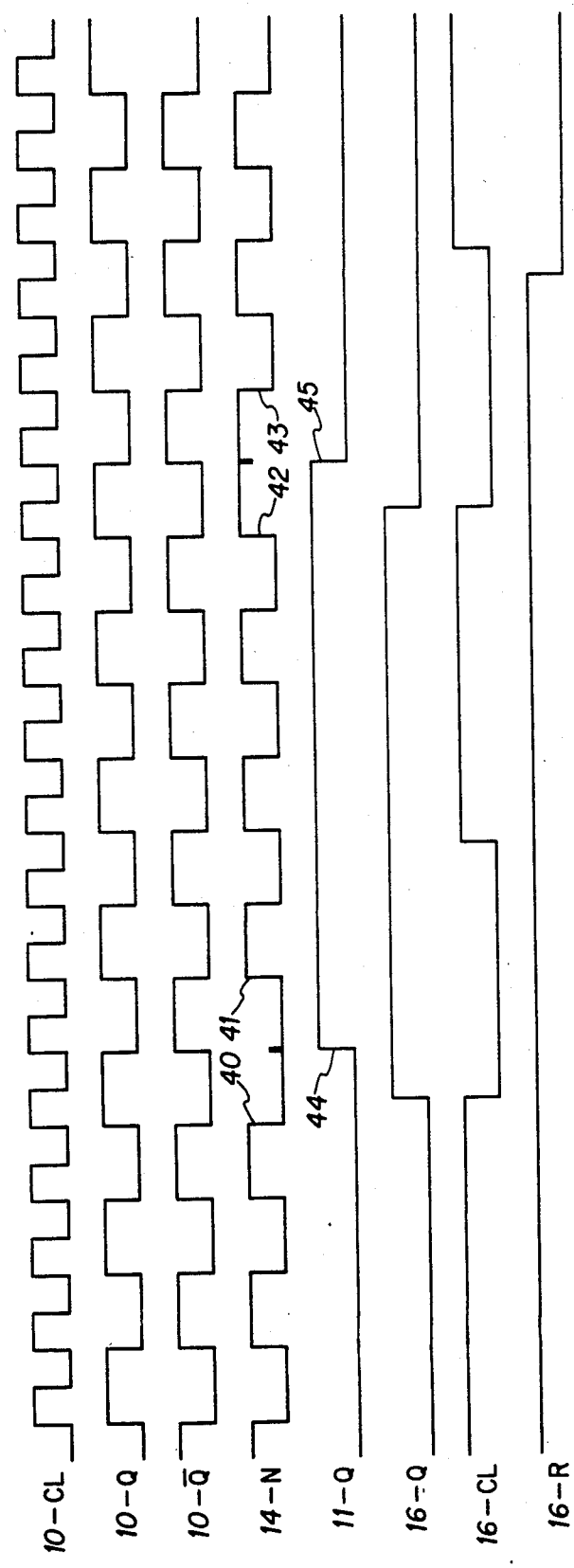
FIG. 3 is a timing diagram of the input divider of FIG. 2.

FIG. 3 is a timing diagram of the operation of the input divide by 2 or 3 circuit 7 in which the waveforms are numbered according to the terminals referenced in FIG. 2. Waveform 10-CL is the waveform of the input signal that is applied to the clock terminal of the divide by 2 flip-flop 10. Waveform 10-Q is the waveform that is present on the Q terminal of the divide by two flip-flop 10 whereas waveform 10-Q not is a complement of waveform 10-Q. Waveform 14-N is the output from the NAND gate 14 and illustrates at sections 40 through 41 and sections 42 through 43 the divide by 3 function of the input divide by 2 or 3 circuit 7. 11-Q is the output of the phase shift flip-flop 11 which results in the shifting of the phase of the output of the divide by two flip-flop 10 at point 44 by the operation of the AND/OR gates 15 and again at point 45. The output of the strobe flip-flop 16 is represented by waveform 16-Q which is applied to the D terminal of the phase shift flip-flop 11. The application of a positive logic level on the D terminal of the phase shift flip-flop 11 results in the shifting of the phase of the output of the divide by 2 flip-flop 10. The strobe flip-flop 16 is enabled by a feedback signal being fed back from the previous stage to its clock terminal at waveform 16-CL and also by a positive signal being present at terminal M1 which is connected to terminal 16-R of the strobe flip-flop 16.

Figure 4:
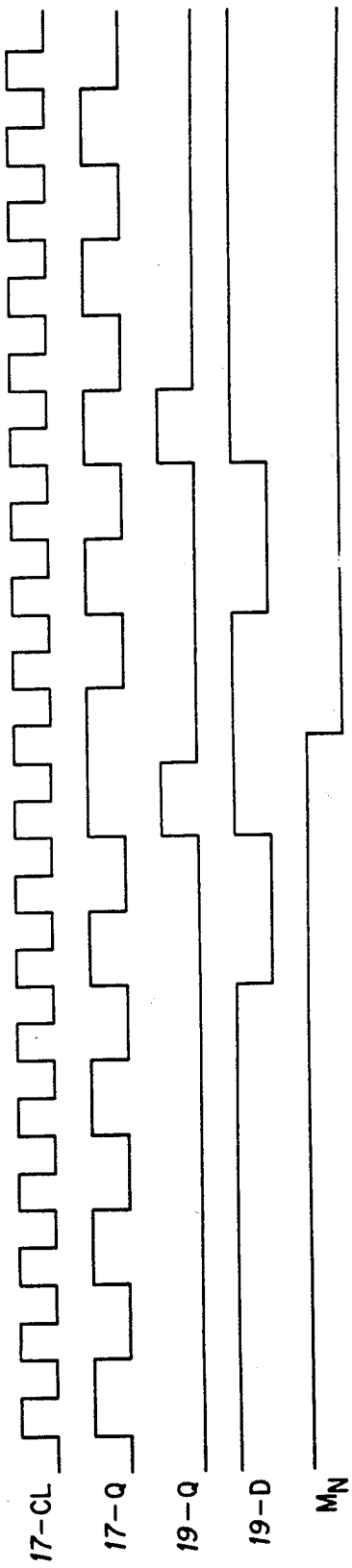
FIG. 4 is a timing diagram of the second stage dividers of FIG. 2.

FIG. 4 is a timing diagram that illustrates the operation of the divide by 2 or 3 circuits 9 and illustrates the input signal being applied to terminal 17-CL of the divide flip-flop 17. The output of the divide flip-flop 17 is represented by waveform 17-Q. Waveform 19-Q is the output of the strobe memory flip-flop 19. The strobe memory flip-flop 19 is clocked by the signal that is represented by waveform 17-CL and is set when there is a logic 1 on terminal 19-D of the strobe memory flip-flop 19. There is a logic 1 on terminal 19-D whenever the output of the NOR gate 21 is at a logic 1, NOR gate 21 NOR's the output of the divide by 2 flip-flop 17 with a strobe signal from a preceding stage. There must be a logic 1 on the $M_N$ terminal in order to implement the divide by 3 function. This is exemplified in FIG. 4 by waveform $M_N$.

The basic modulus of the overall high speed programmable prescaler 2 is $2^N$. If N equals 4 then the basic modulus is 16. It is obvious that the basic modulus may be any binary based number, and since the architecture is binary based, it is ideal for use in a microprocessor controlled system. A selectable moduli is possible by having IL ports 50 and 51 at the output and input of each stage. The IL ports 50 and 51 are selectable connections. The high speed programmable prescaler 2 results in a savings of hardware in circuit elements when compared to a decaded modulo-2 system because no separate control logic or swollow counter is required. The minimum required count is lowered compared to a modulo system. Using the basic modulus of 16 for a modulo 2 system requires a prescaler divide by 16 or 17 on command. Such a system requires a minimum count of 15 in the main counter following the prescaler to produce continuous incremental encoding. Consequently, the minimum allowable overall count is 15×16 or 240. The minimum overall count of the main counter 28 is usually 2 due to look ahead decoding of the final count state. Thus, the minimum overall count is reduced to 2×16=32.

Many changes and modifications in the above described invention can, of course, be carried out without departing from the scope thereof. Accordingly, the invention is intended to be limited only by the scope of the appended claims.

I claim:

1. A high speed programmable prescaler comprising:
   first means forming a first frequency divider circuit for receiving and frequency dividing an input signal by a selectable divisor to provide a first divided output signal;
   second means coupled to said first means for frequency dividing the first divided output signal, said second means comprising a plurality of frequency divider circuits electrically cascaded and constructed such that each receives an input signal and frequency divides that signal by a selectable divisor to produce a divided output signal, the divided output signal of each divider circuit of said cascaded dividers being coupled as the input signal to the next successive divider circuit of said cascaded dividers, said first divided output signal being coupled as the input signal to the first divider circuit of said cascaded dividers, and the divided output signal of the last divider circuit of said cascaded dividers forming a prescaler output signal; and means responsive to a control signal M and coupled to said first and second means for selecting the divisor of said divider circuits of said first and second means such that the prescaler output signal from said second means has a frequency equal to the frequency of the input signal of said first means divided by $2^N+M$, where N is the number of divider circuits in said first and second means, and M is a number having a value from zero to $2^N-1$.

2. The high speed programmable prescaler of claim 1 wherein said first means comprises:

means for frequency dividing the input signal by a first selected divisor and providing a first selected divided output; and means responsive to said control number M for phase-shifting said first selected divided output by 180° to provide that phase-shifted divided output from said first means as said first divided output signal.

3. The high speed programmable pescaler of claim 2 wherein said means for frequency dividing and means for phase-shifting are constructed as flip-flop circuits.

4. The high speed programmable prescaler of claim 2 wherein said means for phase shifting comprises:

a strobe flip-flop coupled to be responsive to said control number M for providing a strobe signal to said means for frequency dividing to phaseshift said first selected divided output by 180°.

5. The high speed programmable prescaler of claim 1 wherein said selectable divisor is a number selected from one of the numbers 2 and 3.

6. A high speed programmable prescaler comprising:

means for receiving an input signal of a selected frequency; and means responsive to a control number M for frequency dividing said input signal a plurality of N times to produce a prescaler output signal which is equal to said input signal divided by $2^N+M$, where M is a number having a value of $0-2^N-1$.

7. The high speed programmable prescaler of claim 6 wherein said means for dividing includes means for selecting a divisor for each of said N divisions from one of the numbers 2 and 3.

* * * * *